United States Patent
Grigorov et al.

(10) Patent No.: US 6,552,883 B1
(45) Date of Patent: Apr. 22, 2003

(54) DEVICES COMPRISING THIN FILMS HAVING TEMPERATURE-INDEPENDENT HIGH ELECTRICAL CONDUCTIVITY AND METHODS OF MAKING SAME

(75) Inventors: Leonid N. Grigorov, San Rafael; Kevin P. Shambrook, Forestville, both of CA (US)

(73) Assignee: Room Temperature Superconductors, Inc., Sebastopol, CA (US)

( * ) Notice: Subject to any disclaimer, the term of this patent is extended or adjusted under 35 U.S.C. 154(b) by 0 days.

(21) Appl. No.: 09/370,101

(22) Filed: Aug. 6, 1999

Related U.S. Application Data

(60) Provisional application No. 60/095,607, filed on Aug. 6, 1998.

(51) Int. Cl.[7] .................................................. H02H 7/00
(52) U.S. Cl. ............................ 361/19; 361/115; 361/225
(58) Field of Search .............................. 361/19, 115, 225

(56) References Cited

U.S. PATENT DOCUMENTS

| | | | | |
|---|---|---|---|---|
| 4,024,318 A | * | 5/1977 | Forster et al. | 428/519 |
| 4,882,466 A | * | 11/1989 | Friel | 219/219 |
| 5,015,824 A | * | 5/1991 | Monter et al. | 219/219 |
| 5,777,292 A | * | 7/1998 | Grigorov et al. | 204/157.15 |

\* cited by examiner

*Primary Examiner*—Stephen W. Jackson
(74) *Attorney, Agent, or Firm*—Lumen Intellectual Property Services, Inc.

(57) ABSTRACT

A polymer material comprising channels whose temperature-independent conductivity exceeds $10^6$ S/cm is used to form conductive films and various devices containing such films. Conduction takes place through threads and channels passing through the film which is otherwise a dielectric. The film is produced by first depositing a macromolecular polymer substance on a substrate. During preparation, the substance is preferably in a viscous liquid state. Stable free electrons (polarons) are then created by ionizing the substance. This is assisted by exposure to UV radiation and the presence of strong polar groups in the polymer. Various enrichment techniques, such as applying a strong electric field, are then used to join the superpolarons together into conducting threads within the medium. To stabilize the positions of the threads, the medium is then solidified, preferably by cooling it below its glass transition point or inducing cross-linking between the macromolecules. The film may be a membrane. Devices incorporating these films include electrical interposers, thermoelectric devices, thermally insulating electrical connectors, pressure switches, field emission devices and fault current limiters. The films can also be used to protect conductors from chemical corrosion without electrically insulating them. They also find application as electromagnetic shielding, reflectors, and polarizers.

15 Claims, 10 Drawing Sheets

4,4'-methylene-biphenyl isocyanate poly(buthyleneglycol adipinat)

DEVICES COMPRISING THIN FILMS HAVING TEMPERATURE-INDEPENDENT HIGH ELECTRICAL CONDUCTIVITY AND METHODS OF MAKING SAME

This application claims priority from U.S. Provisional Patent Application 60/095,607 filed Aug. 6, 1998, which is incorporated herein by reference.

FIELD OF THE INVENTION

This invention relates to materials having very high electrical conductivity. More particularly, it relates to highly conductive materials formed from high molecular weight compounds and techniques for producing such highly conductive materials.

BACKGROUND OF THE INVENTION

Because electrical conductors play such a fundamental and ubiquitous role in modern technology, improvements in conductors are of obvious importance and utility. In particular, because electrical resistivity in conductive materials results in irreversible dissipation of energy, it is clearly desirable to produce materials having a very high conductivity, especially materials having a very high conductivity at or near room temperatures.

U.S. Pat. No. 5,777,292 granted to the present inventors discloses a new type of material having high conductivity at room temperatures. Because of the unique properties of this conductive material, it would be desirable to improve upon its properties and to provide new and useful applications for it.

SUMMARY OF THE INVENTION

Accordingly, the present invention provides improved materials having stable and very high conductivity at room temperatures. In a preferred embodiment, the materials are formed into thin films, membranes, blocks, wires, matrices, aerogels, or other forms. Preferably, the material has an anisotropic electric conductivity, typically in a direction normal to the surface in the case of a membrane or film. The invention also includes various important and useful practical technological applications of these unique materials. Such materials are preferably produced by forming a medium of macromolecular substance, generating free electrons in the medium, inducing these electrons to form electronic channels within the medium, and substantially solidifying the medium to stabilize the positions of the channels. In a preferred embodiment the material substance is a polymer having at least 76.8% single bonds, preferably at least 80% single bonds, and most preferably at least 90% single bonds of all covalent bonds comprising the molecule. In addition, the material has a molecular weight of at least 2 kDa, preferably at least 15 kDa, and most preferably at least 300 kDa. The polymer is preferably a hydrocarbon modified by oxygen such as oxidized atactic polypropylene or oxidized isotactic polyhexene. Alternatively, the polymer is preferably a polyurethane or a polymer such as polydimethylsiloxane which has a silicon-oxygen main chain. A preferred method for producing the material includes forming a thin film of the macromolecular medium and exposing it to UV light in order to assist in the formation of free electrons. The generation of electronic channels within the medium is preferably assisted by one of various enrichment techniques such as heating the medium and exposing it to an electric field, microwaves, or ultrasound. In order to stabilize the positions of the channels to allow reliable conduction through the medium, the preferred method includes a solidification of the medium. Preferably, the solidification is accomplished by cross-linking or by cooling. The material produced by the invention has stable electronic channels whose room temperature conductivity is preferably greater than $10^6$ S/cm, more preferably greater than $10^7$ S/cm, and most preferably more than $10^8$ S/cm. The material is characterized by a Young's modulus preferably greater than 0.1 MPa, more preferably greater than 0.2 MPa, and most preferably greater than 1.0 MPa. The material also has an oxygen content preferably between 0.1 atomic % and 13 atomic %, more preferably between 0.2 atomic % and 12.0 atomic %, and most preferably between 0.3 atomic % and 10.0 atomic %. The material preferably has more than 76.8% single bonds, more preferably has more than 80% single bonds, and most preferably has more than 90% single bonds. A static dielectric constant of the material is preferably greater than 2.4, more preferably greater than 3.0, and most preferably greater than 4.0, measured in a direction perpendicular to the surface of the film at about 1000 Hz. In the form of a thin film, the material of the present invention preferably has electrically conductive channels oriented anisotropically in the direction perpendicular to the surface of the film. As a result, the conductivity of the material is also anisotropic.

DESCRIPTION OF THE DRAWING FIGURES

DETAILED DESCRIPTION OF THE PREFERRED EMBODIMENTS

Theoretical Background

Figure 1:
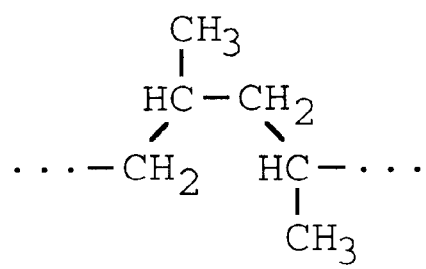
FIG. 1 shows the chemical structure of APP, a polymer used to produce a conductive material according to a preferred embodiment of the invention.

The present invention is based in part on two discoveries. Without being bound by any particular model, the applicants believe that these discoveries have simple theoretical explanations from the viewpoint of modern physics and physical chemistry.

A first discovery is that, if certain conditions are fulfilled, some macromolecular substances may be an exception to the well known fact that organic and element-organic compounds usually have no free electric charges for the conduction of electric current. These conditions are: the substance is preferably in a viscous liquid state, the macromolecules preferably contain a certain amount of polar groups having a large dipole moment (e.g. >C=O, —HC=O, —OH), and the substance preferably has a low percentage of double bonds (low degree of conjugation). Note that the large dipole moment in some compounds may be provided by the elements in the main chain (e.g. Si—O) rather than side groups.

These conditions are sufficient, but are not necessarily met by every such substance. The reasons for these conditions are as follows. Due to the high flexibility of the long macromolecular chains while in the viscous liquid state, the polar groups can easily change their spatial positions and orientations. As a result, the substance is endowed with a high static dielectric constant and has properties close to those of low molecular weight polar solvents. Because electrolytic dissociation in polar solvents leads to spontaneous charge separation, some small concentration of free positive and negative charges will appear. It has been discovered by the inventors that a similar process takes place in the case of many macromolecular substances provided they are in a viscous state and have polar groups. However, rather than the production of negative ions, as in the case of electrolytic dissociation, in this case free electrons appear that are surrounded by oriented dipole groups. These free electrons are called "solvated electrons" or "polarons". Typical equilibrium concentrations of these polarons range from $10^{14}$ to $10^{18}$ polarons per $cm^3$. The polarons are not bonded with parent macromolecules and can move due to heat motion in a flexible liquid macromolecular medium. The free movement of polarons, however, can be lost if the macromolecules have a significant number of conjugated bonds because large conjugated systems can effectively trap the free electrons in empty electron energy levels. In a macromolecular substance satisfying all three conditions, therefore, the substance can experience self-ionization and the charges produced can remain free. The electron mobility, however, is initially quite low compared to metals.

A second discovery made by the inventors dramatically increases the electron mobility. It is found that under certain conditions the state of homogeneously distributed polarons becomes unstable, and due to their mobility polarons begin to join each other resulting in the formation of stable multielectron structures we shall call "superpolarons". Each superpolaron is a multielectron structure running through a cylindrical region in the medium. The superpolaron includes a cloud of homogeneous positive ions and a shell of dipoles oriented in a radial direction by the strong electrical field of the multielectron string. This polarized shell creates a potential well which helps to keep all the electrons together in the cylindrical region and creates a strong overlapping of their wavefunctions. This situation has remarkable consequences. Because the well is a quasi-one-dimensional system, the electrons can obtain a mobility several orders of magnitude higher than that of metals. Moreover, the overlapping of their wave functions also creates a strong exchange interaction which reduces the effect of Coulomb repulsion. Quantum mechanical calculations by the inventors show that the combined influence of both the polarized shell and the strong exchange interaction is sufficient to provide the stable existence of a superpolaron s multielectron structure. In addition, the exchange interaction is most pronounced in the case of quasi-one-dimensional systems. Quantum mechanical calculations by the authors also show that there are no theoretical limitations on the length of superpolarons. It should be noted that the inventors have observed that the conductors of the invention dramatically violate the Wiedemann-Franz law. These conductors, therefore, can be used as thermal insulators and in other applications involving quantum coherence.

In addition to the above-mentioned conditions for the creation of stable polarons, there are additional preferred conditions for the creation and stability of a superpolaron structure: (1) the concentration of electrons in the superpolaron's thread is preferably on the order of $10^{20}$ to $10^{21}$ electrons/$cm^3$, (2) the static dielectric constant is preferably much more than the high frequency dielectric constant (i.e., at least 2.4 to 3), and (3) the medium is preferably simultaneously flexible and viscous. The reasons for these conditions are as follows. The concentration of electrons in the thread is preferably high enough to provide a strong exchange interaction and high electron mobility. Because this concentration is 2–3 orders of magnitude more than the mean concentration of polarons in the self-ionized macromolecular medium, this condition can only be fulfilled if the medium also satisfies the condition that it is flexible enough that the polarons may be collected together. This explains why the superpolaron structure does not appear in the solid state or in highly crystalline compounds. The condition on the static dielectric constant ensures that a sufficiently deep potential well may be created. Although the medium is preferably flexible enough to permit the creation of polarons and superpolarons, it is also prefered to be viscous enough to permit their stability. This explains why superpolarons have not been observed in low molecular weight polar liquids. Only high molecular weight compounds can satisfy this condition because they simultaneously have high flexibility and high viscosity.

The inventors have made an additional discovery that it is possible to improve the stability of the superpolaron structure through chemical alterations of the medium. Because the medium is preferably flexible enough to allow for the initial creation of superpolarons, once they are formed this flexibility also threatens to destabilize the superpolarons. Even in the case where the superpolaron is stable, Brownian motion might interrupt conductivity by shifting the superpolaron's position at the surface of the medium where electrical contact is made. In order to prevent these effects, the inventors have discovered that suitable polymers can be used whose state may be changed from viscous liquid to solid after the creation of superpolarons. After such a transition, the conductivity becomes very stable provided the Young's modulus of the hardened medium exceeds at least 0.1 MPa, preferably at least 0.2 MPa, and most preferably at least 1.0 MPa.

The present inventors have also discovered techniques for increasing the concentration of polarons and/or superpolarons in a macromolecular medium. In a preferred method for producing a highly conductive material of the present invention, these enrichment techniques are used to improve the conductive properties of the material, and to provide superior devices that employ such materials.

Definitions

In view of the above considerations, the following definitions provide a basis for clear and definite interpretation of various terms used in the context of the present description.

A "macromolecular material" is defined to be a material of which a significant percentage is composed of molecules of one or more different kinds having molecular weights of at least 2 kDa. "Significant percentage" in this context means more than 50 volume %, preferably more than 20 volume %, and more preferably more than 5 volume %. In some cases the molecules preferably have a molecular weight of at least 15 kDa, while in other cases at least 300 kDa. A macromolecular material is defined to include, but is not limited to, hydrocarbons, polyurethanes, silicon-oxygen based polymers, biological polymers, and other polymers, copolymers, homopolymers, terpolymers, block polymers, polymer gels, polymers containing plasticizing substances, and mixtures thereof. This definition of macromolecular material is exclusive of pure metals, crystals, and ceramics, although this definition includes macromolecular materials that are doped or mixed with relatively small amounts of low molecular weight organic and inorganic substances, metal, crystal, ceramic, or other such materials.

In the present description, "free electrons" are defined to be electrons that are not bonded individually to specific macromolecules.

"Polarons" are defined as single free electrons that are solvated within a polar macromolecular medium.

A "superpolaron" in this description is defined to be an elementary conducting constituent in a macromolecular material, and is understood to be a stable collection of three or more strongly interacting polarons, which form a conducting multielectron structure.

The term "thread" is defined as one or more superpolarons bundled together in mutual contact within a dielectric medium.

The term "channel" is defined as a thread that is in electrical contact with the surface of the dielectric medium in at least two distinct locations. Preferably, a channel in a film of the present invention provides electrical conductivity through the film from one surface to the opposite surface. This definition, however, does not exclude other types of channels, such as channels providing conductivity between two separate points on the same side of a film, or channels providing conductivity between multiple points on several surfaces.

"Parallel channels" are defined as channels which are non-contacting and all lie within a small angle of each other, where "small angle" is defined to mean less than 30 degrees, preferably less than 20 degrees and more preferably less than 10 degrees.

In the present description a "highly conductive" material is defined to be a material containing threads having conductivity greater than $10^6$ S/cm, preferably greater than $10^7$ S/cm, and most preferably greater than $10^8$ S/cm, for all temperatures below the temperature of decomposition of the material.

A "stable" or "stabilized" material is defined to be a material providing long term stability of highly conductive material, where "long term" means at least 30 days, preferably greater than one year, more preferably greater than ten years.

A "viscous liquid" material is defined to be a material which exhibits plastic flow under any pressure exceeding surface tension pressure, said flow being measurable within one minute.

The term "room temperature" is defined to include any temperature within the range from 275 K to 325 K, , and preferably temperatures within five degrees of 295 K.

The term "near room temperature" is defined to include any temperature within the range from 250 K to 350 K.

An "enrichment" or "enriching process" is defined to be a procedure that increases the concentration of free electrons in a macromolecular medium beyond the original concentration before enrichment. Similarly, an "enriched" material is defined to be a macromolecular material with a plurality of threads whose concentration of free electrons is at least $10^{18}$ free electrons per cubic centimeter, preferably at least $10^{19}$ free electrons per cubic centimeter, and more preferably at least $10^{20}$ free electrons per cubic centimeter.

Method of Producing Stable and Highly Conductive Material

In accordance with the understanding presented above, the inventors have discovered the following preferred method for producing stable and highly conductive materials. In general outline, the method preferably comprises the following steps. First, an appropriate initial chemical compound is chosen that satisfies the conditions for the formation and stabilization of superpolarons. In accordance with the teaching of the invention, this initial compound is preferably a macromolecular substance, and is typically formed as a film. Second, the initial compound is activated or ionized so that free electrons (polarons) are generated in the macromolecular medium. The properties of the activated substance may differ in some ways from those of the initial substance. Third, superpolarons are formed in the activated substance. The combination of polarons into superpolarons is normally associated with an appearance of, and subsequent increase in, the ferromagnetic susceptibility of the substance. This step preferably includes substeps to speed up the creation of superpolarons and to concentrate the superpolarons that have been created to produce an enriched material. Fourth, the formation of a desired electrical conductor material using the superpolarons as building blocks. Fifth, the stabilization of the substance in order to obtain conductive threads in the substance whose positions are relatively fixed. Note that these steps may in some cases take place simultaneously with each other.

Step 1. Choosing the initial compound

Many quite different macromolecular substances can be chosen as the initial compound. Preferably, in their initial unactivated state, all of them are quite good electric insulators, have more than 76.8% single bonds, and have molecular weights more than 2 kDa. In some embodiments the substance preferably has an initial static dielectric constant less than 2.4. The substance in its final state, however, preferably has a static dielectric constant greater than 2.4. The preferred initial compounds fall into three broad classes: hydrocarbons, silicon-oxygen based polymers, and a polyurethane produced by copolycondensation of two components. Preferably, the hydrocarbon is either atactic polypropylene (APP) or isotactic polyhexene (IPH), and the silicon-oxygen polymer is one of four polymers with various end and side groups.

A. APP

APP has the chemical formula $(-C_3H_6-)_n$ and has the chemical structure shown in FIG. 1. The APP molecules preferably have a molecular weight from 4 kDa to 100 kDa. Molecular weights more than 100 kDa can be used also but these are generally more difficult to synthesize. The main chain of APP is made of carbon atoms only. The side groups are hydrogen atoms and methyl groups directed randomly along the chain, causing APP to be completely amorphous. In the bulk, APP molecules are linked only by weak Van der Waals forces, making APP a viscous liquid at room temperature. The structure of APP may be stabilized by cooling below the glass transition temperature ($\approx -20$ C). In order to purify APP prior to preparing an electrical conductor it is often useful to dissolve it in heptane.

B. IPH

Figure 2:
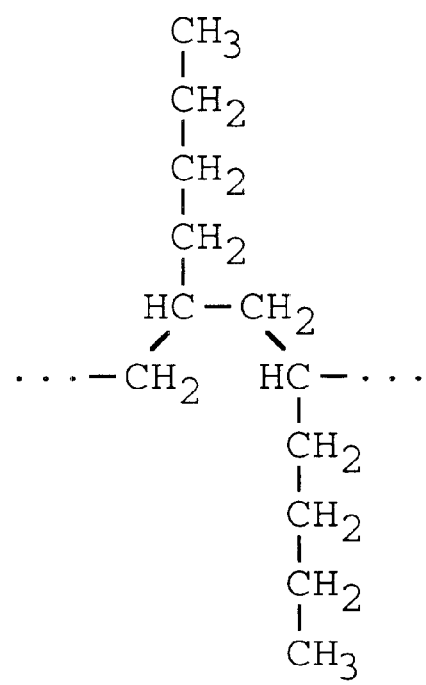
FIG. 2 shows the chemical structure of IPH, a polymer used to produce a conductive material according to a preferred embodiment of the invention.

The second hydrocarbon that is preferably used as the initial compound is IPH which has the chemical formula $(-CH((CH_2)_3CH_3)CH_2-)_n$ and the chemical structure shown in FIG. 2. Preferably, the IPH molecules used have a molecular weight from 300 kDa to 1,000 kDa. High molecular weight IPH molecules can be easily synthesized because of the regular (isotactic) intramolecular structure. The long side groups in IPH prevent any crystalline structure from developing in the bulk. In order to stabilize IPH one may cool it below its glass transition point ($\approx -55$ C).

C. Silicon-Oxygen Polymers: PDMS and alterations thereof

There are various preferred silicon-oxygen polymers that may be used as the initial compound for the formation of an electrical conductor according to the invention. They are all based on a chain of the form (-Si-O-)n, with variations on the side groups and end groups. Because this main chain has such a high flexibility, these polymers have a highly amorphous structure and their glass transition point is typically low (usually around $-130$ C).

Figure 3:
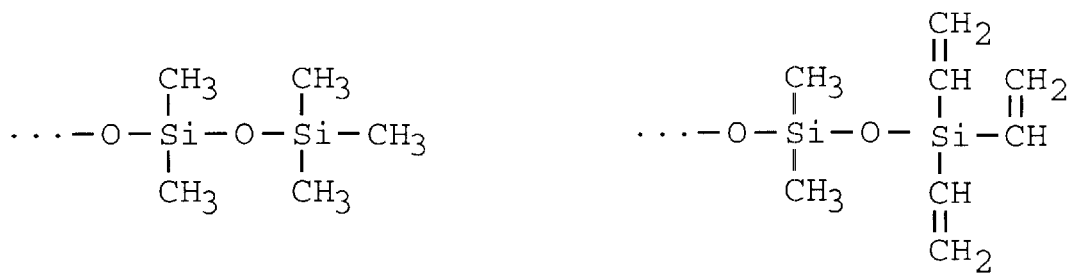
FIG. 3 shows the chemical structure of two forms of PDMS, a polymer used to produce a conductive material according to a preferred embodiment of the invention.

The first type of silicon-oxygen polymer is polydimethylsiloxane (PDMS). In one embodiment, PDMS has three methyl end groups at each end of the chain and preferably has a molecular weight more than 300 kDa. In an alternate embodiment, PDMS has three vinyl end groups at the end of each chain and preferably has a molecular weight more than 15 kDa. The chemical structures of these compounds are shown in FIG. 3.

In the case where PDMS has methyl end groups, chemical bonds between the PDMS molecules do not form. Consequently, this substance is a viscous liquid at room temperature and its stabilization is accomplished by cooling below the glass transition point. On the other hand, in the case where PDMS has vinyl end groups, it is also initially a viscous liquid at room temperature, but it may be stabilized through cross-linking, i.e. breaking the double bonds of the vinyl end groups and forming chemical bonds between PDMS molecules. This chemical reaction can be induced at the desired moment by a special catalyst or by heat. The cross-linking transforms the viscous liquid into a solid. Because cross-linking is possible in this case, the molecular weight does not need to be as high as when cross-linking does not take place. This has the advantage that activation and formation of superpolarons can take place much faster when the molecules are smaller.

Figure 4:
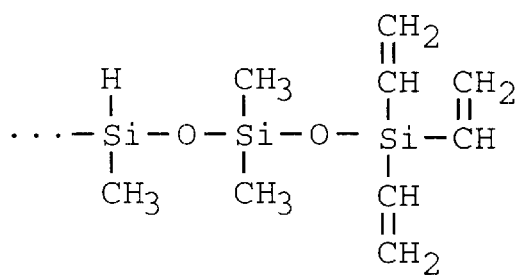
FIG. 4 shows the chemical structure of a PDMS copolymer, a polymer used to produce a conductive material according to a preferred embodiment of the invention.

The second type of silicon-oxygen polymer is identical to the compound just described except that some of the methyl side groups are replaced by hydrogen to form a copolymer, as shown in FIG. 4.

The substitution of hydrogen atoms permits quicker and stronger stabilization when cross-linking because the hydrogen can easily link with the vinyl end groups. Preferably, smaller molecules (down to as small as 2 kDa) are used in order to increase the number of ends that can cross-link and increase the stability. With this molecule, the preferred fraction of methyl side groups that are replaced with hydrogen is 25%.

Figure 5:
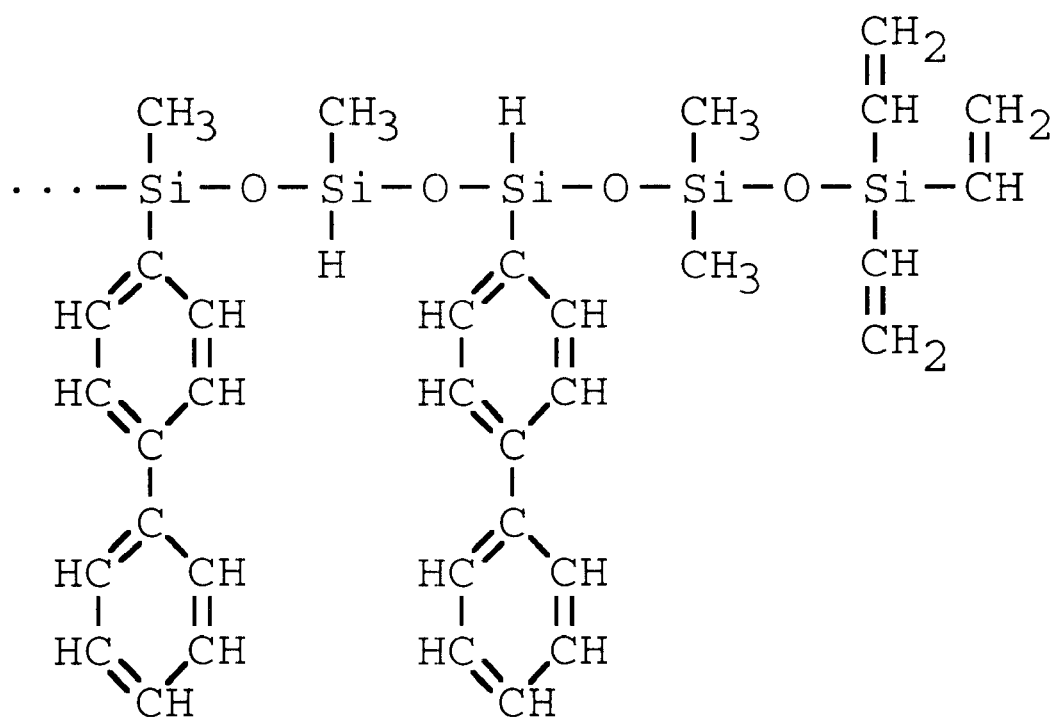
FIG. 5 shows the chemical structure of yet another form of PDMS, a polymer used to produce a conductive material according to a preferred embodiment of the invention.

In order to increase the density of cross-linking and improve stabilization, it is desirable to decrease the number of links in the main chain without decreasing the molecular weight. One way to accomplish this is to substitute large diphenyl groups for the methyl side groups. This can be combined with the substitution of hydrogen side groups as discussed above. An example of such a copolymer is shown in FIG. 5.

Although a conductor may be formed from any one of the above silicon-oxygen polymers, conductors may also be formed through a combination or mixture of several of the above polymers and copolymers. One preferred mixture is PDMS having methyl end groups mixed with the copolymer having vinyl end groups and diphenyl side substitutes. The most preferred mixture is the copolymer having vinyl end groups and hydrogen side substitutes mixed with the copolymer having vinyl end groups and no side substitutes. Moreover, different side substitutes altogether may be used to provide additional variations of the above polymers. For example, acrylic side substitutes may be used as well, allowing cross-linking under shortwave UV treatment. Therefore, it will be appreciated by those skilled in the art that other side substitutes may be used in accordance with the teaching of the invention in order to obtain the necessary conditions for stabilization. Anyone of ordinary skill in the art would consider such alternate side substitutes obvious in view of the teaching provided herein. Moreover, other mixtures may be produced to facilitate the creation and stabilization of conductors as well.

D. Polyurethanes

Figure 6:
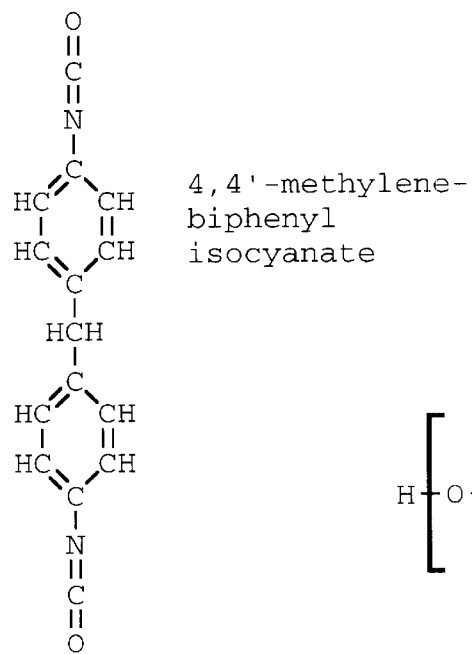
FIG. 6 shows the chemical structures of two components used to form a polyurethane, a polymer used to produce a conductive material according to a preferred embodiment of the invention.

The initial compound used for the creation of the conductor may also be chosen from the class of polyurethanes. Preferably, the polyurethane is the product of a copolycondensation of two components, 4,4'-methylenebiphenyl isocyanate and poly-(buthyleneglycol adipinat), whose chemical structures are shown in FIG. 6.

Figure 7:
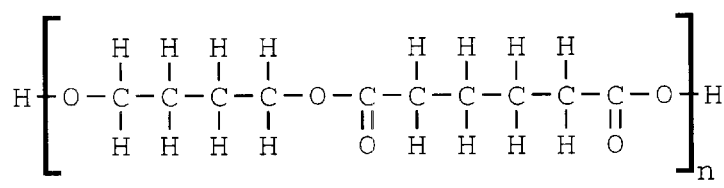
FIG. 7 shows the chemical structures of the polyurethane produced by the copolycondensation of the two polymers shown in FIG. 6.
Figure 7:
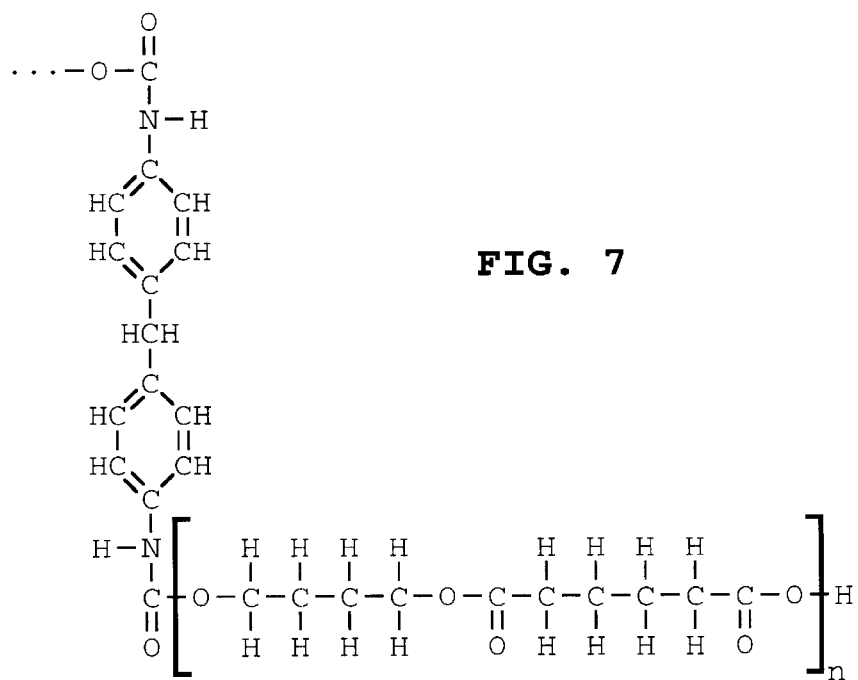

The factor n is chosen so that the second component has a molecular weight around 2 kDa. During copolycondensation the two components are connected into large links. The resulting copolymer has the chemical structure shown in FIG. 7.

This polymer contains a high concentration of specific chemical groups (i.e., OC=O) having large dipole moment, giving it a larger static dielectric constant of about 4. The oxygen content is preferably between 6.6% and 15.7%, and is more preferably near 12%. The preferred molecular weight of this compound is between 4.5 kDa and 10 kDa. It can be dissolved in various organic solvents, for example, dimethylformamide. In contrast to the previous compounds discussed, this compound may be partially crystallized at room temperature, with the crystalline phase at thermodynamic equilibrium being above 50% by volume. This polymer, however, may be converted to a completely amorphous phase by heating above 62 C. Once superpolarons have been formed it can then be cooled back down to room temperature. Note, however, that it may take hours or days for the crystalline content to reach equilibrium.

All the initial chemical compounds discussed above may be used for the electrical conductor preparation, as well as variations of these and alternate compounds as would be obvious to those skilled in the art in view of the teaching contained herein. Indeed, as has been shown through the above examples and explained in the theoretical description, an appropriate chemical substance may have quite a different fine chemical structure and may be based on different main chain constructions. The substance preferably has certain physical properties. In particular, a satisfactory initial compound is preferably in an amorphous viscous liquid state during certain stages of the preparation of the conductive material. The static dielectric constant of the initial compound is preferably capable of reaching more than 2.4 after the compound is activated. The initial compound (after any cross-linking) should have a low mean fraction of conjugated pieces. Preferably, the concentration of single bonds should be greater than 76.8% of the total number of chemical bonds, more preferably, greater than 80%, most preferably greater than 90%. The initial compound is preferably a macromolecular substance having a molecular weight of at least 2 kDa. The initial compound preferably also has the property that it can be stabilized after forming the conductor, e.g., by cross-linking or by cooling down to a temperature where the matrix becomes sufficiently stable. Finally, it should be noted that the selection of the initial compound may also be subject to considerations of the particular conditions under which the conductor will eventually be used.

Step 2. Activating the compound

The aim of this step is to generate and accumulate stable free electrons in the macromolecular medium. The activation comprises several steps common to all the initial substances. Certain substances, however, require additional steps due to their particular characteristics.

In one preferred embodiment, in order to create stable free electrons in the macromolecular substance, the medium is ionized and the electrons stabilized in the macromolecular medium. The inventors have discovered that stable free electrons can be created under circumstances where flexible macromolecular chains having polar chemical groups are adsorbed on the surface, or if macromolecules participate in the surface interphase interaction between two different phases which are present together in a heterogeneous medium. From a thermodynamical point of view, electrons can be stabilized in a free state if the macromolecular ions and the electrons are strongly solvated by the polar medium, giving the necessary energetic gain to prevent Coulomb. bonding. From a kinetic point of view, ionization is normally very improbable due to the high energy of 5 eV to 6 eV that is required. However, certain processes that are normally forbidden or highly improbable in the bulk can easily take place at the surface of a medium. In particular, a large molecule adsorbed on a solid surface has a large energy of adsorption which causes the molecule to be in specific conformations that enhance its polarization and deformation. As a result, the ionization potential can be dramatically reduced. In short, while the macromolecules in the bulk may be difficult to ionize, the same molecules adsorbed on the surface can be ionized easily, perhaps with the help of relatively weak ionization factors such as thermofluctuations or exposure to UV radiation. Once a stable macro-ion has been created at the surface, it is then desorbed from the surface and migrates into the volume of the medium. Because the diffusion can be quite slow, it may take days or even weeks for a high concentration of free electrons to accumulate in the volume of the material. This time can be reduced, however, if the ratio of surface area to volume is very high during the activation stage of the conductor preparation, e.g., by activating the medium while in the form of a thin film or aerogel.

The first stage of the activation in the preferred embodiment is to increase the ratio of surface area to volume by forming a thin film of the macromolecular substance on the surface of a solid substrate. Although films as thick as 100 $\mu$m have been produced, preferably the film has a thickness of 20 $\mu$m to 30 $\mu$m, except for the silicon-oxygen polymer films which have a preferred thickness of 5 $\mu$m to 15 $\mu$m. The nature of the solid substrate is not very significant and could be a metal, glass, semiconductor or any other solid that does not react chemically with the film. Preferably, the film is formed on the surface of gold or glass. The film may be prepared by techniques well known in the art, such as by melting. The film may also be prepared by dissolving the compound in a solvent, spraying the solution over the surface of the substrate and evaporating the solvent. To speed the evaporation process, the film may be heated, preferably to temperatures between 40 C and 70 C, except for the polyurethane compound which is preferably heated near 80 C so that it is well above its melting point of 62 C. Note that if the film is formed by sputtering or spraying, the activation process may be enhanced by ionizing the droplets as they are deposited.

If the initial compound chosen was one of the hydrocarbons, then the activation step includes a thermooxidation of the film in order to introduce oxygen-containing polar groups. The film is heated in air at a temperature of 100 C to 110 C for 1–2 hours. The exact duration of the heating may be controlled by monitoring the IR-spectrum and static dielectric constant of the film until they indicate the presence of carbonyl groups. When the content of oxygen reaches at least 0.1 atomic percent and the static dielectric constant reaches at least 2.4, the thermooxidation is complete.

The next stage in the activation of the film is the ionization of the adsorbed macromolecules, e.g., by ionizing radiation or chemical ionization. In the preferred embodiment, the ionization is performed by exposing the film to UV radiation. In the preferred embodiment, a 120 Watt mercury lamp having a 5 cm tube at a working pressure of 0.2–0.3 MPa is positioned about 5 cm from the film. Any other method of exposing the film to similar UV radiation, however, also will be sufficient. A typical exposure time under the above conditions is 1.0–1.5 hours, except for the silicon-oxygen polymers which are typically exposed for 4–6 hours. The exact duration of exposure can be controlled by monitoring the magnetic properties of the film. From an analysis of the form and intensity of the dependence of the magnetic moment on the applied external magnetic field, one can determine the concentration of stable free electrons in the film. When the concentration of free electrons is at least $3\times10^{17}$ electrons/cm$^3$, then the UV irradiation is complete. It should be noted that overexposure to UV radiation can begin to break the main chains of the macromolecules.

To enhance the diffusion of the ionized macromolecules and free electrons during the activation step, the medium may be subjected to agitation or vibration. For example, ultrasound may be applied steadily at 1 W/cm$^2$ or in pulses of higher intensity. The diffusion may also be enhanced by heating the medium to reduce viscosity.

Step 3. Creating superpolarons

The inventors have discovered that the polarons that are created and diffused into the macromolecular medium during the activation step can contact each other and form stable multielectron structures called superpolarons, as well as longer conductive threads composed of multiple superpolarons. Because increased ferromagnetism is indicative of a collective behavior of electrons due to a quantum mechanical exchange interaction, the presence of superpolarons can be detected by monitoring the ferromagnetic susceptibility of the polymeric medium. Note that the accumulation of polarons and superpolarons can also be monitored by a measurement of the static dielectric constant of the medium. The ferromagnetic saturation appears to occur at 0.5–5.0 kGauss at room temperature. The time needed to reach ferromagnetic saturation depends on the initial compound used and on the thickness of the film because the migration of the polarons from the surface and their collision within the volume depends on the diffusion coefficient of the substance. Typically this time is from several hours to several weeks, but may be made shorter by certain techniques such as heating the substance or exposing it to microwave radiation. Microwave power levels may range from 100 W to 10 kW, where the higher power levels are pulsed to avoid overheating the substance. The microwaves resonate with the superpolarons and increase their mutual attraction.

Motivated by experimental evidence and certain theoretical assumptions, the inventors have discovered that several naturally occurring superpolarons may be joined together into longer superpolaron threads provided that their concentration is high enough. Without being bound to any particular theory, it is estimated that such joining of superpolarons requires a concentration of at least $10^8$–$10^9$ superpolarons/$cm^3$. In order to obtain sufficient concentration for this joining, the medium is preferably subjected to enrichment techniques. Because the superpolarons have a magnetic susceptibility and can be strongly polarized by an electric field, the application of external electric or magnetic fields can be used to concentrate the superpolarons. Based on this teaching, it will be appreciated by anyone of ordinary skill in the art that many techniques are possible for concentrating the number of superpolarons in the medium.

Figure 8:
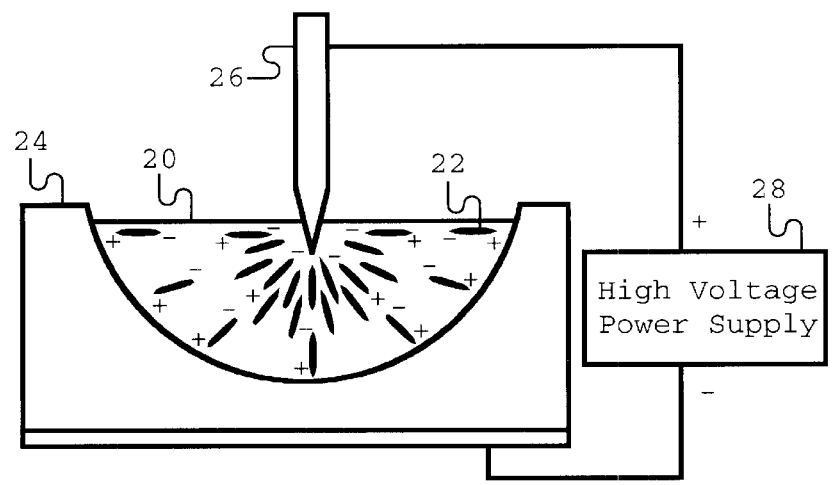
FIG. 8 illustrates a technique developed by the inventors for increasing the concentration of conductive elements in the macromolecular medium.

One example of such an enrichment technique is shown in FIG. 8. A viscous medium 20 containing superpolarons 22 is placed in a small cup 24 made of an appropriate dielectric material. The preferred diameter of the cup is 5–6 mm, although other diameters are possible. A sharp tip of an electrode 26 is placed in the medium near the center of the top surface and a high voltage is applied through a high voltage power supply 28. Preferably, a voltage of 5–10 kV is applied for several hours. Many superpolarons are naturally drawn toward the electrode tip and concentrated there. The superpolaron-enriched medium in the vicinity of the tip is then collected.

This technique can be performed with multiple electrodes if desired. It should also be noted that this procedure can be performed analogously by the application of a magnetic field instead of an electric field.

One object of the enrichment process is to produce a medium with a larger density of superpolarons, each of which has many free electrons associated with it. An enriched material is normally required to produce useful conductors. In practice, most enriched materials produced by the above techniques will have higher densities of $10^{19}$ to $10^{20}$ free electrons per cubic centimeter, or possibly more.

Step 4. Forming a conductor from the compound

Once the macromolecular medium has been enriched, the material can then be used to form several types of conductors. For example, thin conducting films can be formed with the direction of conductivity perpendicular to the plane of the surface. In the case of films that are thinner than the average length of the superpolarons, the enrichment process is not necessary for conduction through the film because the superpolarons are already long enough to conduct through the film. The enrichment does, however, produce a larger density of conducting channels through the film. For films much thicker than the average superpolaron length and for the creation of long wires, however, a prefered method is to join the superpolarons to form long conducting threads in the medium. Having created a sufficiently large density of superpolarons by the enrichment technique, the superpolarons can be joined by techniques that induce attractive forces between neighboring superpolarons. These techniques, like the enrichment techniques, are based on the fact that the superpolarons can be induced to have a large electric dipole moment, or a magnetic dipole moment. Thus, electric fields, magnetic fields, or a combination of electric and magnetic fields may be used to induce the superpolarons to join together forming long conducting threads in the medium.

Figure 9:
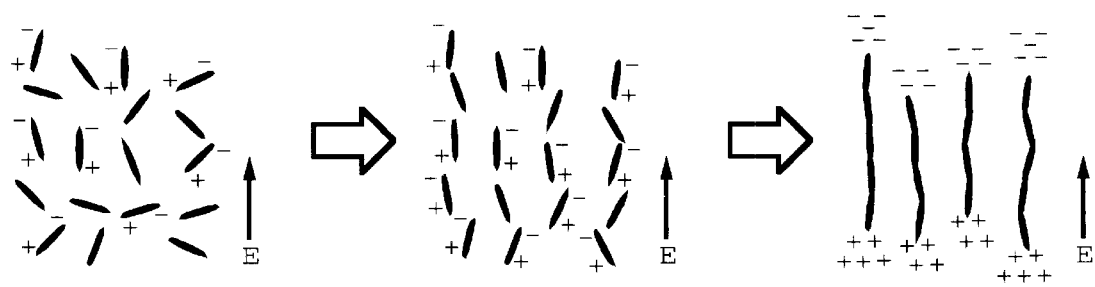
FIG. 9 illustrates a technique devised by the inventors for increasing the length of conductive elements by joining conductive elements together.

One approach to forming a conductor is to expose the medium to a strong homogeneous electric field, for example, by placing the medium between two metal plates and applying a high voltage across the plates. Due to the induced electric dipole moment of the superpolarons, they will tend to rotate so they are aligned parallel to the field lines. In addition, the superpolarons will tend to link up end-to-end, as is shown in FIG. 9, to form conductive threads.

Note that some of the superpolarons, may join together in this manner during the enrichment process as well. Alternatively, the same dipole attraction illustrated in FIG. 9 is also created when an alternating magnetic field is applied to the material. The flux change induces an alternating electric dipole moment in the superpolarons that results in their mutual attraction. This mutual attraction can be enhanced by doping the medium with small conductive microscopic particles. Note that, although these particles are conductive, they do not participate substantially in the high conductivity through the material that is provided by superpolaron channels.

Depending on the techniques used to speed up the creation of superpolarons, this process may take as long as several hours. The macromolecular medium will then have numerous conductive threads. In principle, there is no theoretical limit to the length of an electronic thread that may be formed.

Another method for creating superpolarons and longer threads is to place a thin film of the substance on a conductive substrate and place an electrode on the surface of the film. The electrode is initially used to apply an electric field that induces the creation of superpolarons. When conduction through the medium is initiated, however, current pulses are sent through the conducting channel. When the channel can carry a significant current, say 1 Amp, then the electrode is raised slightly. The film should be kept in contact with the raised electrode by the application of pressure on the sides or by other techniques.

Step 5. Stabilizing the compound

Once the conducting superpolaronic threads have been formed in the medium, they are generally stable structures. Brownian motion of the polymer segments, however, may cause the threads to be displaced within the medium. In particular, the ends of the threads will not necessarily remain at the surface of the medium or at the same place on the surface. Consequently, it is preferable to stabilize the macromolecular medium so that reliable electrical contact with the threads can be established at fixed points on the surface of the film. The stabilization of the medium can be accomplished in several ways. Provided this stabilization takes place while conductive threads are in electrical contact with the surface, the result will be stable conductive channels connecting separate points on the surface of the medium.

A first way to stabilize the medium is through cross-linking. As discussed in the above description of the initial macromolecular compounds, if specific chemical groups are included in the initial compound, then cross-linking may be produced between the macromolecules, thereby causing the medium to transform from a viscous liquid to an elastic solid state at room temperature. The cross-linking results in the appearance of a nonzero Young's modulus, which is a quantifiable measure that the medium has transformed into a substantially solid phase. In the case of the silicon-oxygen polymers, cross-linking may be produced by heating the substance at 150 C for 1.0–1.5 hours.

Another way to stabilize the medium is to increase the viscosity of the matrix so much that the Brownian motion becomes negligibly small. For example, the amorphous polymer matrix may be cooled below its glass transition temperature. Although such a cooled matrix is still a liquid in principle, its viscosity is so high that it has the properties of a solid. For compounds with a glass transition temperature below room temperature, the stable operation of the conductor takes place at a temperature below room temperature. Some compounds, however, have a glass transition point above room temperature. For these compounds, the steps of preparing the conductor take place while the medium is heated above room temperature. When the medium is then cooled to room temperature, the conductor naturally stabilizes. In the case of polyurethane, cooling below 62 C is connected with the formation of microcrystals in the macromolecular medium. It should be noted that if the content of microcrystal exceeds approximately 50% by volume, then the conductivity suddenly disappears.

Yet another way to increase the viscosity of the macromolecular matrix is to introduce small amounts of hard microscopic particles into the matrix. Preferably, these particles are small non-conducting balls having a diameter of 0.01 $\mu$m and up to 10% concentration by volume. This technique is especially effective in the case of the polyurethanes because microscopic crystals are produced in the amorphous phase of the matrix, causing it to become more viscous. Note that these particles may also be used to enhance the ionization and creation of free electrons. In this case, only 1 vol. % concentration is needed.

The essential result of the various techniques for stabilization is to give the medium the properties of a solid. In particular, the inventors have found that sufficient stabilization is produced when the Young's modulus of the medium is at least 0.1 MPa. In accordance with this teaching, it will be appreciated by those skilled in the art that other techniques may be used for producing a Young's modulus of at least 0.1 MPa, thereby causing the required stabilization. Preferably, the Young's modulus is at least 0.1 MPa. More preferably, it is at least 0.2 MPa, and most preferably, the Young's modulus is at least 1.0 MPa.

A conductor produced by the above method has the characteristic properties shown in column 7 of Table 1. The other columns list the corresponding properties of other known types of conductors.

TABLE 1

|  | Metals and metal alloys | Ceramics | Superconducting Salts | Conjugated polymers | Compound of Bourgoin | published polymer films | Invention |
|---|---|---|---|---|---|---|---|
| Molecular Weight | inorganic | inorganic | low | high | high plus metal | high 70K–300K | high >1,000 |
| Room Temp. Conductivity | <10^6 S/cm | <10^4 S/cm | low, SC at T < 12K | <10^5 S/cm | >10^6 S/cm | >10^11 S/cm | >10^11 S/cm |
| Crystallinity | Polycrystal | Polycrystal | Crystal | Polycrystal | ? | ~0 vol % | <50 vol % |
| Single Bonds | N/A | Many | Few, many double | Few, many double | Many | Many ~100% | Many >76.8% |
| Young's Modulus | >10^4 MPa | >10^4 MPa | >10^4 MPa | >10^3 MPa | ? | 0 (liquid) | >0.1 MPa |
| Oxygen Content | <0.1% | >30% | may be present | 0 | some | 3–5% | 0.1–13% |
| Static Dielec. C | ∞ | ? | ? | ∞ | ? | >4.0 | >2.4 |
| Low MW doping | no | no | yes sometimes | yes | no | no | no |
| Conduct. Particles | no | no | no | no | yes | no | no |
| Conduct. Stability | very high | high | very high | moderate | ? | low | very high |

It should be emphasized that a physical model has been presented in the above description in order to motivate the procedure and provide a deeper understanding of the essential properties of the conductor. The presentation of this model, therefore, provides teaching that enables those skilled in the art to perform many variations and alterations of the details without undue experimentation. Nevertheless, it should also be emphasized that the particular disclosed steps for preparing electrical conductors enable anyone skilled in the art to practice the invention independent of the model. For example, the following procedure describes the steps performed to produce a particular conductor without making any reference to the model.

Detailed Procedure for Producing a Highly Conducting Film

Figure 10:
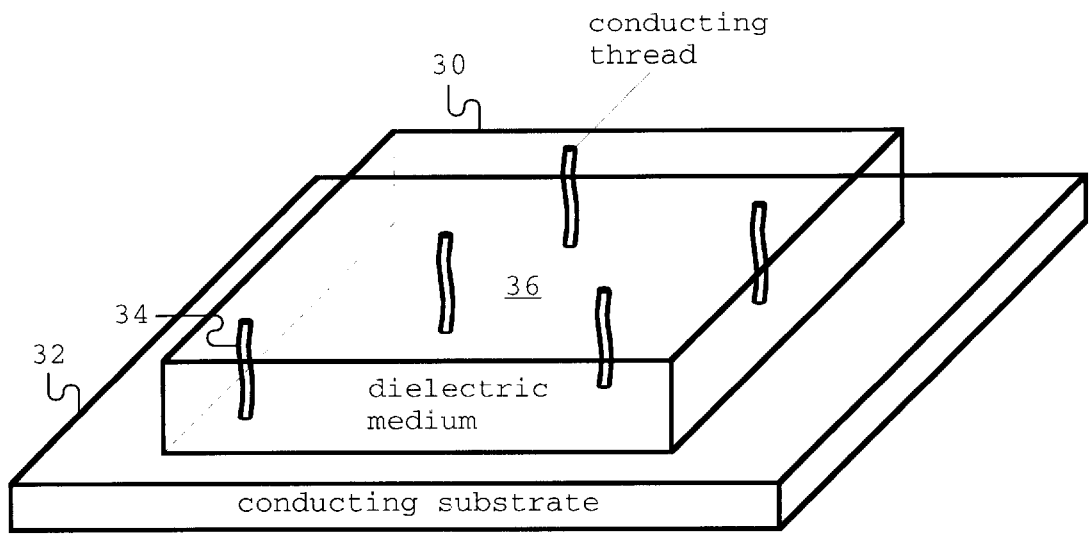
FIG. 10 shows an embodiment of the invention in the form of a thin film with conductive channels passing from one side to the other.

In a preferred embodiment of the invention, a highly conductive material is prepared in the form of a thin film 30 positioned on a conducting substrate 32, as shown in FIG. 10. The material that is produced will have a number of small conducting channels 34 through the film separated by dielectric regions 36. The film will have anisotropic electric conductivity corresponding to the orientations of the channels, typically in a direction predominantly normal to the surface of the film.

Step 1

Form a mixture of PDMS having vinyl end groups (at 60 vol. % with molecular weight about 100,000) and the copolymer differing from this in that it has hydrogen side substitutes (at 40 vol. % with molecular weight 5,000). This mixture will initially be a viscous liquid at room temperature.

Step 2

Dissolve the polymer medium in an appropriate solvent such as toluene such that the concentration of the polymer substance in the solution does not exceed 1%. A conducting substrate is cleaned with the solvent and the solution is sprayed onto the surface of the substrate using a gas flow of dry nitrogen. The temperature of the substrate during spraying should be maintained between 40 C and 70 C. The exact temperature and the rate of spraying are controlled such that the drops of solution falling on the surface dry before the next drop falls on the same point. The duration of the spraying depends on the thickness of the film desired. Spraying is performed for about an hour to obtain a film 15 $\mu$m thick.

Although free electrons are spontaneously formed during and after spraying, this process is preferably quickened by UV treatment of the film. In the preferred embodiment, a 120 Watt mercury lamp having a 5 cm tube at a working pressure of 0.2–0.3 MPa is positioned about 5 cm from the film for 4–6 hours at room temperature. The UV exposure should be continued until the ferromagnetic susceptibility indicates that the mean concentration of the free electrons in the film exceeds at least $3 \times 10^{17}$ electrons/cm$^3$. The ferromagnetic susceptibility can be measured by the well known Faraday method.

Steps 3 and 4

Figure 11:
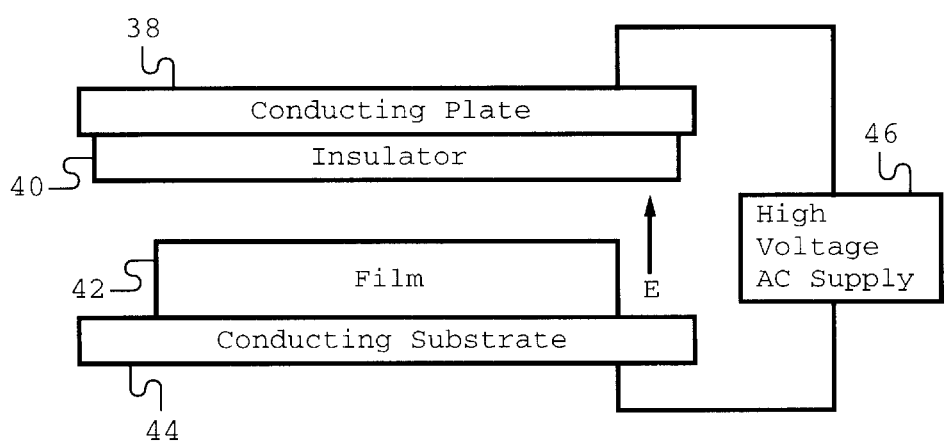
FIG. 11 illustrates a technique developed by the inventors for creating long conducting threads in a macromolecular medium.

In the case of a thin film conductor steps 3 and 4 may be combined as follows. As shown in FIG. 11, a conducting plate 38 with a layer of insulating material 40 is positioned close to the film 42 which is positioned on a conducting substrate 44. AC voltage is applied by a high voltage power supply 46 to create a mean electric field intensity of 20–25 kV/cm between the conducting substrate and the conducting plate. The alternating voltage should be applied for approximately ten days.

In the final stage of conductor preparation, the polymer medium is heated to 150 C for 1.5 hours. Preferably, the high voltage applied during the previous step is maintained during this heating period. As a result of heating, the macromolecular medium will transform into an elastic solid and the Young's modulus should exceed the minimum value of 0.1 MPa. After the completion of this step the film is ready to be used.

Figure 12:
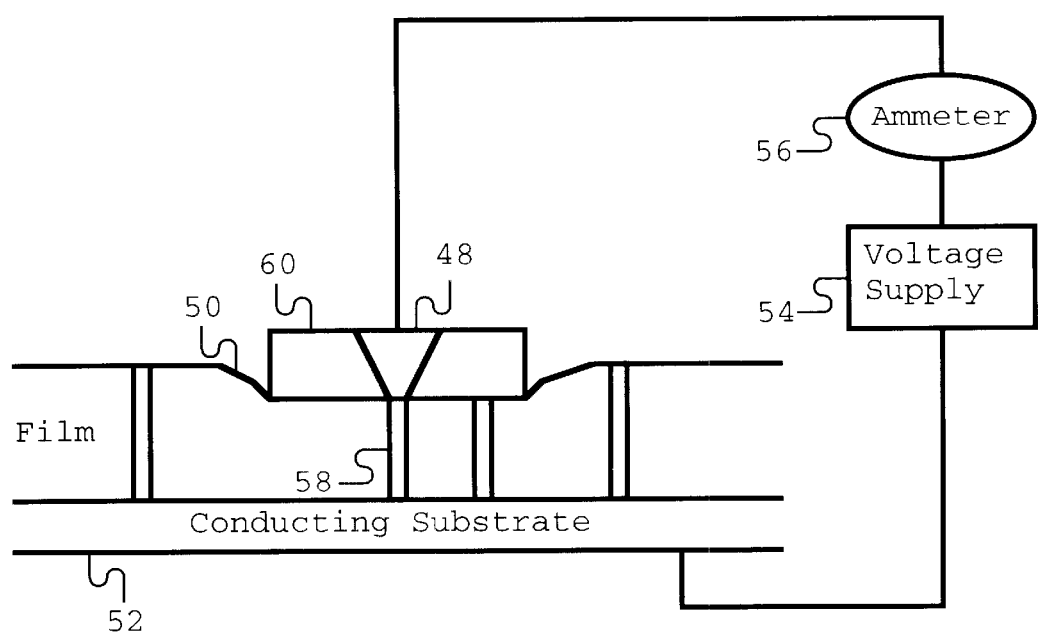
FIG. 12 illustrates the technique used by the inventors for testing the electrical properties of a conductor of the invention.

If all the steps of the preparation have been completed with care, the density of conducting channels through the film may be as large as 10,000 channels/cm$^2$, having an average spacing of about 0.1 mm. The typical mean diameter of each conducting point on the surface is 2 $\mu$m to 4 $\mu$m. The conductivity through the film may be tested as shown in FIG. 12 by placing a flat conducting electrode firmly on the upper surface of the film 50 and applying a voltage between the electrode 48 and a conducting substrate 52 upon which the film 50 rests. A voltage supply 54 is used to apply the voltage and an ammeter 56 measures the resulting current. To measure the properties of individual conducting channels 58 in the film, the flat electrode 48 should firmly contact only a small area of the film surface. In order to prevent damage to the film due to the application of force to such a small area, the electrode is preferably provided with a protective insulating ring 60 as shown.

Preferably, the electrode 48 is made of copper or gold and the insulating ring 60 is made of glass or hard plastic. The surface diameter of the electrode can be easily made as small as 10 $\mu$m to 50 $\mu$m using this technique. Care should be taken that the electrode is polished and coplanar with the ring so that it properly contacts the film.

The total resistance of the substrate-channel-electrode system can be measured and used to calculate an upper limit on the resistance of the channel by subtracting the resistances of the substrate, the electrode, and the tunnel resistances at the contact points. Using a current not exceeding 50 mA the resistance of the channel can at times be measured to be less than 0.001 $\Omega$. Based on a channel diameter of 2 $\mu$m to 4 $\mu$m and a length of 15 $\mu$m, it follows that the conductivity of the channel is significantly more than $10^6$ S/cm.

The conductivity of the channels can be measured more precisely using a current of 200 mA or more. This corresponds to a current density of over $10^6$ A/cm$^2$, so it is applied in short pulses to avoid local damage to the electrodes. Current pulses as large as 10–20 A can be used if their half-width is a microsecond or less. Simple calculations based on measurements of the heat generated in the film as a result of these pulses place an upper limit of $10^{-5}$ $\Omega$ on the resistance of a channel. It follows that the conductivity of the channel exceeds $10^8$ S/cm.

Alternate Embodiments

Table 2 shows the various conductor preparation parameters used for alternate embodiments of the invention.

TABLE 2

| | Hydrocarbons | | Silicon-Oxygen based polymer | | | | Polyurethane |
|---|---|---|---|---|---|---|---|
| | APP | IPH | PDMS | vinyl end groups | vinyl end grps, some with H side grps | vinyl end grps, diphenyl side grps | |
| Mol Weight in kDa | 4–100 | 300–1000 | 300–1000 | 15–100 | 75–100, 2–10 | 2–10 | 4.5–10 |
| Sing Bond Content | 100% | 100% | 100% | >99% | >97.5% | >76.8% | >97% |
| Polymer Solvent | heptane | heptane | toluene | toluene | toluene | toluene | dimethylformamide |
| Film Prep. Conditions | 40–70 C. 0.5–4 hr | 40–70 C. 0.5–1 hr | 40–70 C. 0.25–1 hr | 40–70 C. 0.25–1 hr | 40–70 C. 0.25–1 hr | 40–70 C. 0.25–1 hr | 80 C. 24 hr |
| Initial Dielectric C | 1.9–2.0 | 1.9–2.0 | 2.7 | 2.7 | 2.7 | 2.7 | 4.0 |
| Thermo- | 1–2 hr | 1–2 hr | None | None | None | None | None |

TABLE 2-continued

| | Hydrocarbons | | Silicon-Oxygen based polymer | | | | |
|---|---|---|---|---|---|---|---|
| | | | | vinyl | vinyl end grps, some with H | vinyl end grps, diphenyl | |
| | APP | IPH | PDMS | end groups | side grps | side grps | Polyurethane |
| oxidation | 100–110 C. | 100–110 C. | | | | | |
| Final content of oxygen | 0.1–5 atomic % | 0.1–5 atomic % | 10 atomic % | 10 atomic % | 14 atomic % | 2.8–3.1 atomic % | 6.6–15.7 atomic % |
| UV exposure time | 1–1.5 hr | 1–1.5 hr | 4–6 hr | 4–6 hr | 4–6 hr | 4–6 hr | 1–1.5 hr |
| Final Dielectric C | >2.4 | >2.4 | 2.7 | 2.7 | 2.7 | 2.7 | 4.0 |
| Production Temperature | 18–20 C. | 18–20 C. | 18–20 C. | 18–20 C. | 18–20 C. | 18–20 C. | 80 C. |
| Time for Cond creation | 2–14 days | 1–7 days | 3–10 days | 3–10 days | 3–10 days | 3–10 days | 10–30 min |
| Stabilization Process | cool to −20 C. | cool to −55 C. | cool to −130 C. | 150 C. for 1.5 hr | 150 C. for 1.5 hr | 150 C. for 1.5 hr | cool to 62 C. |
| Final Crystal Phase Content | 0% | 0% | 0% | 0% | 0% | 0% | <50% |
| Max. Film Thickness | 50–80 μm | 20–25 μm | 15–18 μm | 15–18 μm | 15–18 μm | 12–15 μm | 20 μm |

Note that the fifth column in the table corresponds to the 60%–40% mixture of two compounds used for producing the film of the preferred embodiment. The procedures for preparing these alternate types of conductors are the same as for the preferred embodiment, with the exception of the differences indicated in the table which have already been described in detail.

To initiate conduction through a channel a small voltage may be required. For example, about 3 volts applied through a 1 Megohm resistor that limits the current. In addition, it may be required to apply pressure to the surface of the medium, typically on the order of 0.5–5.0 kg/cm$^2$ for small areas and about 5 kg/cm$^2$ for a square centimeter. Note that this pressure is easily achieved (100 g on a 1 mm diameter probe is over 10 kg/cm$^2$).

Figure 13:
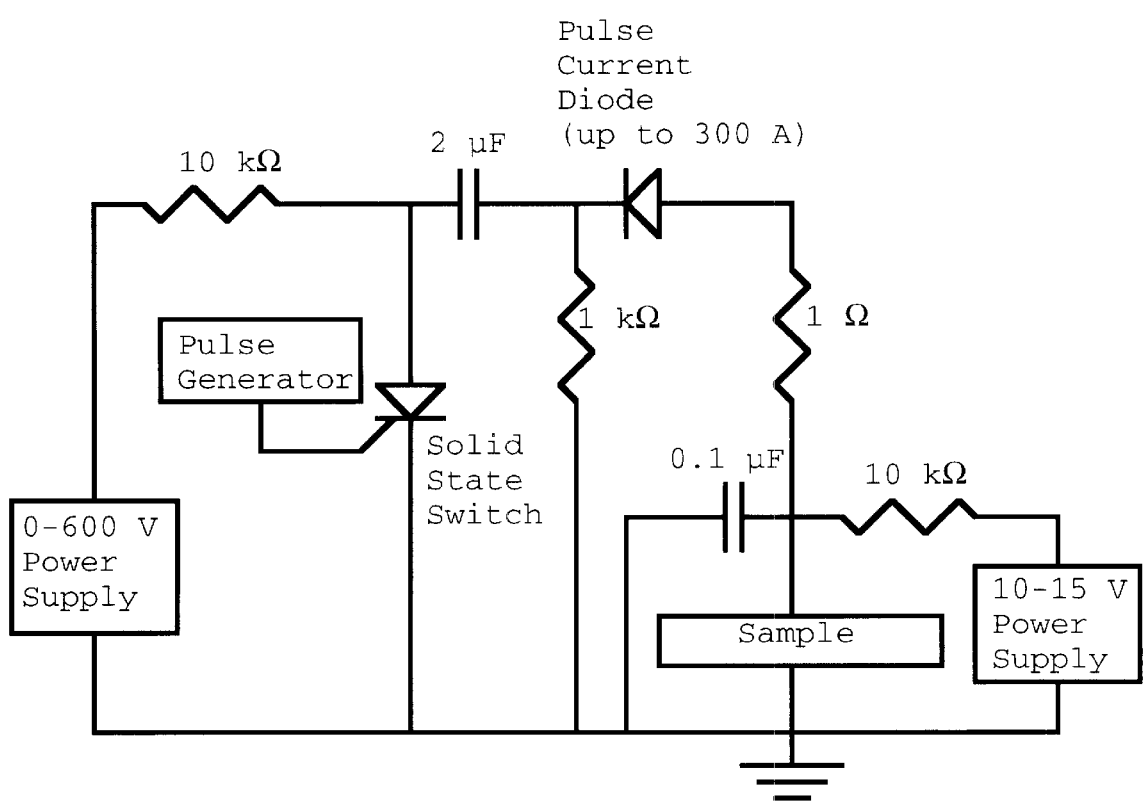
FIG. 13 is a schematic diagram of a circuit to improve the conductive properties of a material of the invention.

It should be noted that it is possible to enhance conductivity by carefully "training" the samples with a long set of current pulses of gradually increasing amplitude. Smooth bell-shaped pulses with 1–10 μs half-width repeated at 1–10 Hz are used. The initial pulse amplitude is 1 mA or less per channel and the final pulse amplitude is 10 Amps per channel. The amplitude is increased linearly with time for 30–60 min. Well-trained "young" samples of silicon based polymer have maximal current amplitude of about 10 Amps/channel. On the other hand, "old" samples can have a maximal (critical) current of over 200 Amps/channel. Well-trained samples can keep low resistivity for several hours in some cases while carrying little or no current. The circuit used to train the samples is shown in FIG. 13. This training technique can enhance the conductivity by raising the allowed current densities and by lowering the resistivity.

It will be clear to one skilled in the art that the initial macromolecular compound used to form the conductor is not limited to those specifically discussed in this disclosure. In particular, any macromolecular substance that satisfies the conditions for the formation of stable superpolarons as disclosed in the teaching of the invention is sufficient to form a highly conductive material. Other methods may be used for inducing ionization of the macromolecular medium and for inducing the creation of superpolarons and threads.

Devices Comprising Highly Conducting Films

The inventors have discovered that highly conductive films produced as described above may be used to produce new and useful interposer devices, i.e., thin or thick film electrical connectors, normally with a plurality of parallel channels which are electrically isolated from one another. In addition to exploiting the highly conductive properties of the films, these interposer devices also exploit the unique property of anisotropic conduction enjoyed by these films. The film shown in FIG. 10, for example, has no conduction between distinct channels, and has all the channels oriented roughly normal to the surface of the film. Consequently, the film conducts electricity only in the direction normal to the surface of the film, and does not permit the flow of electricity in any direction parallel to the film surface. Thus, the film is a particular type of anisotropic conductor. Because the films of the present invention are naturally anisotropic conductors, they can be used as interposers in various devices, as will be described now in more detail.

Figure 14:
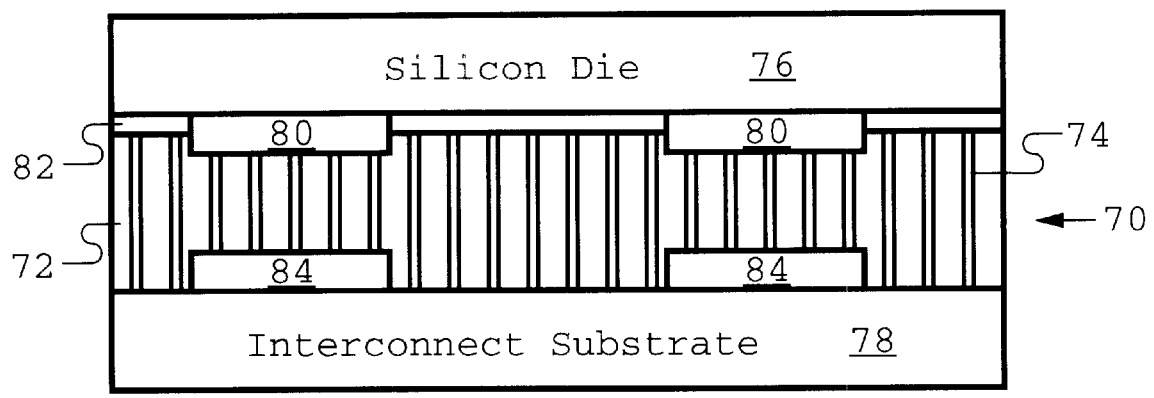
FIG. 14 is a cross-sectional diagram illustrating an electrical interposer employing a conductive material of the present invention.

One embodiment of an electrical interposer according to the At present invention is illustrated in FIG. 14. The interposer 70 is a layer of highly conductive film comprising a dielectric medium 72 and conductive channels 74 oriented normal to the surface of the film. The film 70 is positioned between a silicon die 76 and interconnect substrate 78. The die 76 has conducting pads 80 and insulating regions 82. Similarly, the substrate 78 also has conducting pads 84. The conducting pads on both the silicon die and the substrate are in direct contact with the interposer film. The conductive channels 74 in the film provide electrical conduction through the film between pads 80 of the die and pads 84 of the substrate. Only pads which are opposed to each other on the two sides of the film are electrically connected by the channels in the film. The interposer, therefore, is useful as an electrical "flip-chip" connector used, for example, in chip scale packaging. The interposer may also be used in a similar way between two interconnect substrates. Because the interposer has anisotropic conductivity, it does not need to be patterned as some other interposers known in the art. The interposer of the present invention also enjoys the advantage that the channels are typically separated by 10 microns or less, allowing a much higher density of distinct interconnections through the film than is provided by other known techniques, such as conductive fillers in epoxy. Yet another advantage of the interposer of the present invention is that it is capable of carrying much more current and has lower resistivity than any other interposers known in the art.

Another application of the conductively anisotropic film is to provide a protective layer on the surface of a conductor. For example, the film illustrated in FIG. 10 may be a polypropylene film. on a copper substrate. The film will protect the copper against chemical corrosion and oxidation.

In contrast with other protective films, however, the present film does not electrically insulate the substrate, but provides excellent conduction through the film via the conductive channels. As a result, the protected substrate can still be used as an electrical connector or electrode. The film thus acts as an electrical interposer between the conductive substrate and other conductive elements which may be used to conductively contact the substrate through the film.

A freestanding film or membrane can also be used in a variety of ways, as an intermediate production step for a device, or as a device such as a magnetic shield. The freestanding film may be produced by peeling the film off the substrate, for example with a blast of air. In order to maintain the integrity of the film in isolation from the substrate, it may be necessary to strengthen the film, preferably by cross linking, or by reducing the temperature below the glass transition temperature. Another technique for producing a freestanding film is to make the film on a substrate that can be dissolved, etched, or otherwise removed from the film without damaging the film itself. For example, the film can be made on a sodium chloride substrate that is then dissolved with water, leaving just the film.

Figure 15:
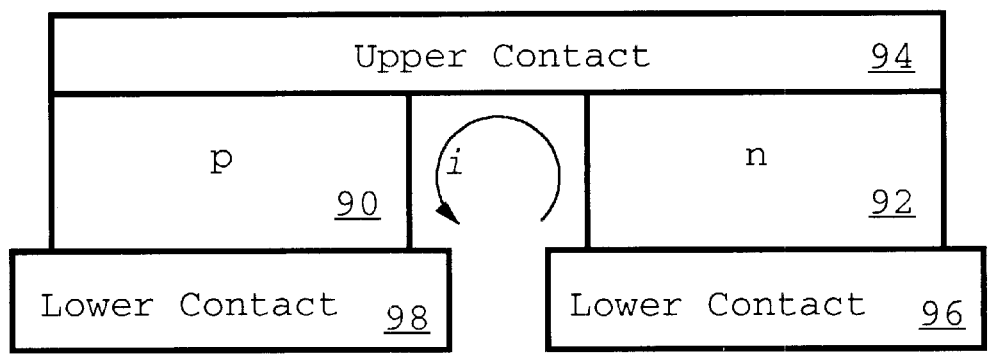
FIG. 15 is a cross-sectional diagram illustrating a conventional thermoelectric device.

It has been reported in the art that the Z factor of a thermoelectric device can be increased by using a conventional superconductor as the passive leg of the device. Although the material of the present invention is distinct in certain respects from conventional superconductors, it shares with superconductors the property of violating the Wiedemann-Franz law. Thus, the inventors have recognized that a film of the present invention can be used to provide an improved thermoelectric device that does not suffer from the disadvantage that it requires cooling to liquid Nitrogen temperatures. FIG. 15 is a cross-sectional diagram illustrating a conventional thermoelectric device having two active legs, a p-type leg 90 and an n-type leg 92. The legs are both connected to an upper contact 94, and to separate lower contacts 96 and 98. By passing an electrical current i from lower contact 96 to lower contact 98 via the upper contact 94, heat is pumped from the upper contact 94 to the lower contacts 96 and 98, causing the upper contact to be cold and the lower contact to be hot. Conversely, the device can also be used to generate current from a thermal differential between the upper and lower contacts.

Figure 16:
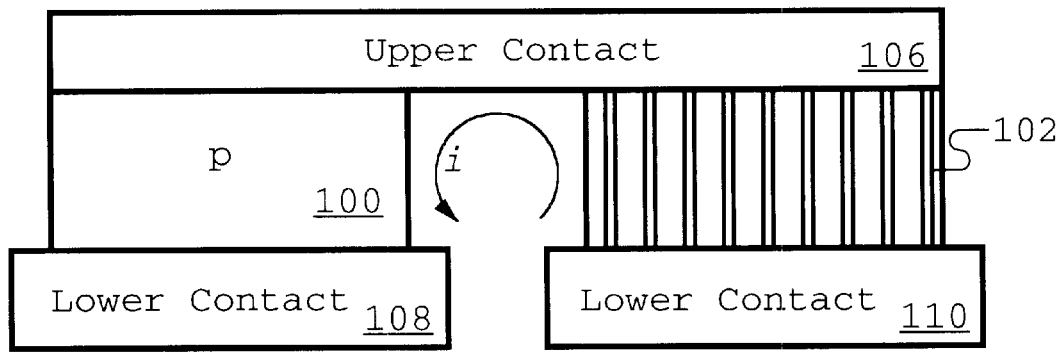
FIG. 16 is a cross-sectional diagram illustrating a thermoelectric device employing a conductive material of the present invention.

The figure of merit, Z, for the conventional device is approximately the average of the figures of merit, $z_n$ and $z_p$, of the two materials used for the legs. The value of z for a leg is given by $z=\alpha^2 \sigma/\lambda$, where $\alpha$ is the Seebeck coefficient, $\lambda$ is the thermal conductivity and $\alpha$ is the electrical conductivity. The value of Z for the device may be increased from 95% to 99% by constructing the device with a film of the present invention, as shown in FIG. 16. The device in this case has a p-type leg 100 as in the conventional device. Instead of the n-type leg, however, the device of the invention is composed of a film interposer 102 of the present invention. As in the conventional device, the legs are both connected to an upper contact 106, and to separate lower contacts 108 and 110. The increase in Z for this device is due to the fact that, with the highly conductive leg substituted, the Z of the device is no longer the average of the z values for the two legs, but is approximately equal to the z value of the active leg. Thus, to optimize the Z for the device requires only the optimization of z for the active leg.

Figure 17:
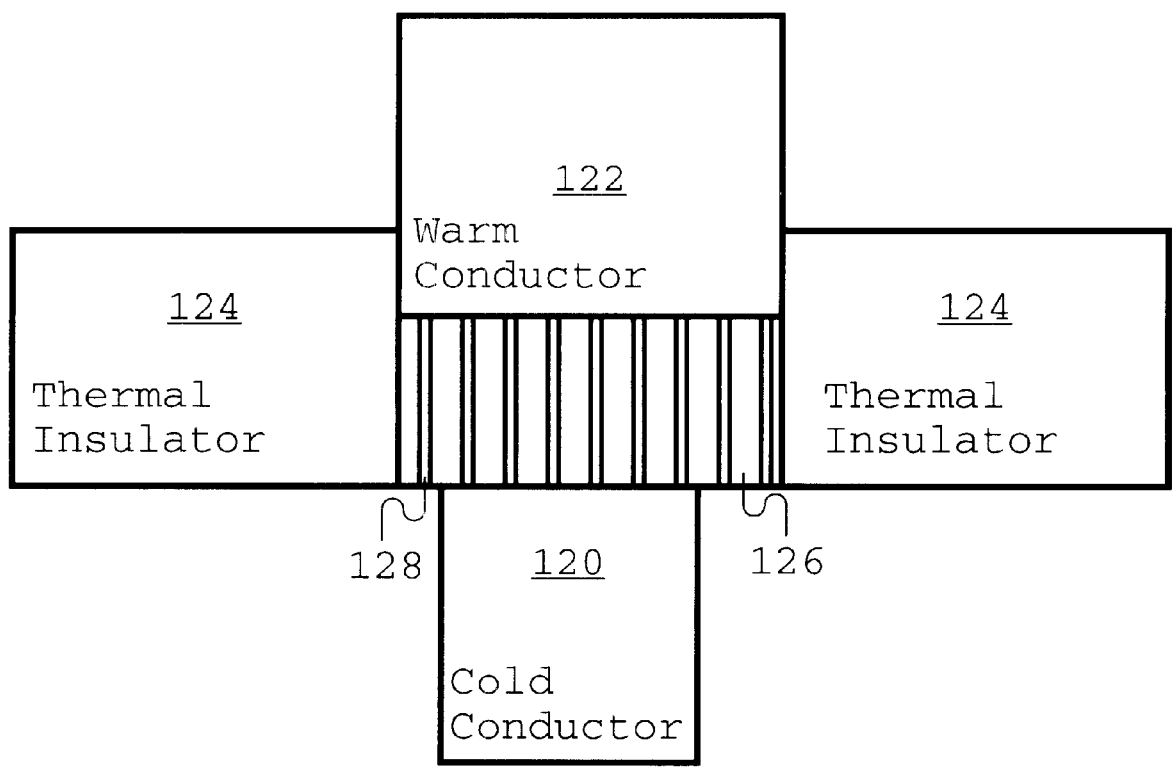
FIG. 17 is a cross-sectional diagram illustrating a thermal barrier employing a conductive material of the present invention.

Highly conductive films according to the invention are also useful for conducting electrical power or signals while blocking the flow of heat. This unique combination of properties is desirable, for example, when a circuit is refrigerated and needs to be thermally isolated from heat flow from other circuits with which it is in electrical contact. FIG. 17 is a cross-sectional diagram illustrating a thermal barrier employing a conductive material of the present invention. A conductor 120 in a low temperature region is thermally insulated from a conductor 122 in a high temperature region by conventional thermal insulation 124 and a film interposer 126 comprising conductive channels 128. The film provides thermal insulation between the two conductors while conductive channels in the film provide electrical contact between the conductors. This arrangement might be used, for example, in an infrared detector, or to thermally insulate a cooled superconductor from ambient temperature electrical circuits.

The films of the present invention can also be used as a fault acurrent limiter, i.e., to limit the current when there is a fault or short circuit that needs to be isolated from other circuits. The two circuits in this case are connected by a film of the present invention. If a current larger than a maximum critical current is passed through the film, the resistance of the film becomes very large, thereby limiting the flow of current and electrically isolating one circuit from the other. This is not the same as a fuse, since the increase in resistance is not due to a heating effect.

Highly conducting films of the present invention can also be used as electromagnetic shielding. In this particular application, it should be noted that the threads need not form channels connecting one surface to the other, and need not be commonly oriented. An anisotropy of the threads, however, can be used to provide the film with certain unique properties. For example, with the conductive threads all oriented in one direction, the interaction of the film with incident electromagnetic waves will depend on the relative orientation between the waves and the thread orientation. The film can thus be used for reflecting and polarizing electromagnetic waves, or for modulating signals.

Field emitter devices (FEDS) are used in many appliations such as flat screen displays. The FED is based on the emission of electrons at the microscopic tip of a conductor, where the electric field is inversely proportional to the radius and is consequently very high. The films as shown in FIG. 10 will emit from the ends of the channels, and may be used as FEDs, typically with individual control of the voltage on each channel. Channels for an FED would be typically less than 1 micron diameter, and preferably less than 0.1 micron diameter.

The highly conducting film may also be used as a pressure switch, by being made an interposer between two conductors. In a preferred embodiment the film in this case is produced with threads near the surface, but no channels at zero pressure. When pressure is applied through the conductor, the film is deformed and some threads become channels, connecting the previously isolated conductors.

It is understood that the examples and embodiments described herein are for illustrative purposes only and that various modifications or changes in light thereof will be suggested to persons skilled in the art and are to be included within the spirit and purview of this application and scope of the appended claims. All publications, patents, and patent applications cited herein are hereby incorporated by reference in their entirety for all purposes.

What is claimed is:

1. An electrical device comprising:
   a) a first electrical conductor;
   b) a second electrical conductor; and
   c) a macromolecular film electrically connecting the first electrical conductor to the second electrical conductor, by one channel or by a plurality of parallel channels in a direction substantially perpendicular to a surface of the film, wherein the channels have a conductivity of at least $10^6$ S/cm at temperatures below a temperature of decomposition of the macromolecular film.

2. The device of claim 1 wherein the film has a free electron density of at least $10^{18}$ free electrons per cubic centimeter.

3. The device of claim 1 wherein the film thermally insulates the first electrical conductor from the second electrical conductor.

4. The device of claim 1 wherein the device is a thermoelectric device.

5. The device of claim 1 wherein the device comprises a pair of electronic circuits contacting each other via the film, wherein only corresponding points on opposite sides of the film are connected.

6. The device of claim 1 wherein the film prevents the physical contact of said conductors and hence protects said conductors from chemical corrosion.

7. The device of claim 1 wherein the device is a fault current limiter.

8. An electrical device comprising:
a) a first electrical conductor;
b) a second electrical conductor; and
c) a macromolecular film electrically insulating the first electrical conductor from the second electrical conductor when there is no pressure on the first electrical conductor, and electrically connecting the first electrical conductor to the second electrical conductor when there is pressure on the first electrical conductor, said connecting being by one channel or by a plurality of parallel channels in a direction substantially perpendicular to a surface of the film, wherein the channels have a conductivity of at least $10^6$ S/cm at temperatures below a temperature of decomposition of the macromolecular material.

9. An electrical device comprising:
a) a first electrical conductor;
b) a second electrical conductor; and
c) a macromolecular film electrically connected to the first electrical conductor by one channel or by a plurality of parallel channels in a direction substantially perpendicular to a surface of the film, wherein each channel emits electrons across a small gap to the second electrical conductor when a voltage is applied between the said conductors, and wherein channels have a conductivity of at least $10^6$ S/cm at temperatures below a temperature of decomposition of the macromolecular film.

10. A device comprising an array of the devices of claim 8.

11. A device comprising a macromolecular film comprising highly conductive threads, said threads preferably being modified in position by an electromagnetic field, said device preferably being capable of shielding, modulating and polarising electromagnetic waves.

12. The device of claim 11 wherein said conductive threads are parallel, and preferably modify an electromagnetic wave or field, and more preferably the direction of said threads is controlled by a second electromagnetic field, which most preferably thereby influences the first electromagnetic wave or field.

13. The device of claim 11 wherein a substantial percentage of said threads form conducting loops, and modify electromagnetic waves, and more preferably modify or exclude magnetic fields.

14. A method of protecting a conductor from chemical corrosion, by coating it with a highly conductive macromolecular film having a conductivity of at least $10^6$ S/cm at temperatures below a temperature of decomposition of the macromolecular film.

15. A method of creating a highly conducting membrane, comprising the steps of forming a highly conducting macromolecular film on a substrate, and peeling the film off said substrate, or removing said substrate by dissolving said substrate or etching away said substrate.

* * * * *